(12) United States Patent
Nohata

(10) Patent No.: US 10,720,923 B2
(45) Date of Patent: Jul. 21, 2020

(54) POWER CONVERSION APPARATUS AND VEHICLE

(71) Applicant: SUBARU CORPORATION, Tokyo (JP)

(72) Inventor: Kohei Nohata, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 0 days.

(21) Appl. No.: 16/449,640

(22) Filed: Jun. 24, 2019

(65) Prior Publication Data

US 2020/0076431 A1 Mar. 5, 2020

(30) Foreign Application Priority Data

Aug. 29, 2018 (JP) .................................. 2018-160818

(51) Int. Cl.
*H02P 6/14* (2016.01)
*H03K 17/693* (2006.01)
(Continued)

(52) U.S. Cl.
CPC ............ *H03K 17/693* (2013.01); *H02M 7/64* (2013.01); *H02P 27/06* (2013.01); *H03K 2017/6878* (2013.01)

(58) Field of Classification Search
CPC ........ H02M 7/64; H02P 27/06; H03K 17/693; H03K 2017/6878
See application file for complete search history.

(56) References Cited

U.S. PATENT DOCUMENTS 5,986,420 A * 11/1999 Kato ..................... E05F 15/619
318/1
6,909,253 B2 * 6/2005 Ogura ..................... E05B 81/60
318/272
(Continued)

FOREIGN PATENT DOCUMENTS

JP 2010-98790 A 4/2010
JP 2013-62914 A 4/2013
(Continued)

OTHER PUBLICATIONS

Notification of Reasons for Refusal issued in corresponding Japanese Patent Application No. 2018-160818 dated Apr. 7, 2020, with machine translation.

*Primary Examiner* — Alexander H Taningco
*Assistant Examiner* — Kurtis R Bahr
(74) *Attorney, Agent, or Firm* — Troutman Sanders LLP

(57) ABSTRACT

A power conversion apparatus includes positive-side and negative-side switching elements, positive-side and negative-side gate drive circuits, and a gate signal controller. The positive-side switching element is disposed between a positive-side direct-current bus and an output node. The negative-side switching element is disposed between a negative-side direct-current bus and the output node. The positive-side and negative-side gate drive circuit are configured to turn on and off the positive-side and negative-side switching elements, respectively. The gate signal controller is configured to transmit to the positive-side and negative-side gate drive circuits gate signals to instruct turning on and off the positive-side and negative-side switching elements. The gate signal controller is configured to, when a short circuit between the positive-side direct-current bus and the negative-side direct-current bus is detected, transmit to the posi- (Continued)

tive-side gate drive circuit a first gate signal and transmit to the negative-side gate drive circuit a second gate signal.

13 Claims, 5 Drawing Sheets

(51) Int. Cl.
  *H02M 7/64* (2006.01)
  *H03K 17/687* (2006.01)
  *H02P 27/06* (2006.01)

(56) References Cited

U.S. PATENT DOCUMENTS

| 7,782,098 | B2* | 8/2010 | Hashimoto | H02M 3/07 327/108 |
| 8,191,311 | B2* | 6/2012 | Sakamaki | E05F 15/46 49/26 |
| 9,419,512 | B2* | 8/2016 | Ueda | H02H 7/122 |
| 9,692,332 | B2* | 6/2017 | Taoka | H02P 6/182 |
| 10,003,249 | B2* | 6/2018 | Momota | H02M 1/08 |
| 10,186,952 | B2* | 1/2019 | Jimichi | H02M 7/483 |
| 10,366,964 | B2* | 7/2019 | Obara | H01L 24/09 |
| 2012/0146567 | A1* | 6/2012 | Iwaji | H02P 29/02 318/504 |
| 2012/0153719 | A1* | 6/2012 | Inaba | B60L 3/003 307/10.1 |
| 2016/0079904 | A1* | 3/2016 | Krishnamurthy | H02P 27/06 318/504 |
| 2016/0099665 | A1* | 4/2016 | Chen | B60L 53/14 318/400.27 |
| 2017/0201204 | A1 | 7/2017 | Kawano et al. | |
| 2019/0089253 | A1* | 3/2019 | Toshiyuki | H03K 17/063 |

FOREIGN PATENT DOCUMENTS

JP   2017-112642 A   6/2017
WO   2016/038683 A1   3/2016

* cited by examiner

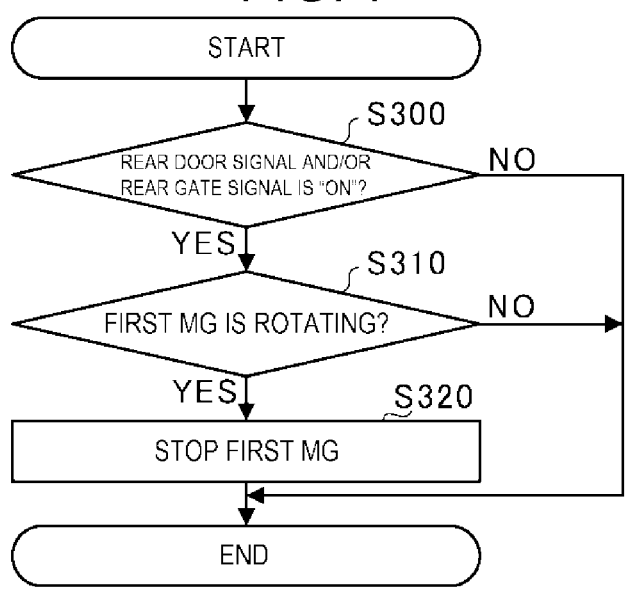

POWER CONVERSION APPARATUS AND VEHICLE

CROSS-REFERENCE TO RELATED APPLICATIONS

The present application claims priority from Japanese Patent Application No. 2018-160818 filed on Aug. 29, 2018, the entire contents of which are hereby incorporated by reference.

BACKGROUND

The disclosure relates to a power conversion apparatus including switching elements turned on and off by gate drive circuits, and to a vehicle including the power conversion apparatus.

A power conversion apparatus includes pairs of switching elements, and each pair of switching elements are connected in series and inserted between a positive-side direct-current (DC) bus and a negative-side DC bus. An output node is connected between each pair of switching elements connected in series.

In the power conversion apparatus, switching elements may be fixed in an on state. This is called a short-circuit malfunction (a fixed "on" state). When both of a switching element between the positive-side DC bus and the output node (hereinafter referred to as a "positive-side switching element") and a switching element between the negative-side DC bus and the output node (hereinafter referred to as a "negative-side switching element") have a short-circuit malfunction, and when one of the positive-side switching element and the negative-side switching element is turned "ON" while the other has a short-circuit malfunction, a short circuit occurs between the DC buses.

In view of this, disclosed is a technique to reduce unfavorable influences such as breakage of various devices connected to the power conversion apparatus when the switching elements have a short-circuit malfunction to cause a short circuit between the DC buses (see, for example, Japanese Unexamined Patent Application Publication No. 2010-98790).

SUMMARY

An aspect of the disclosure provides a power conversion apparatus including a positive-side switching element, a negative-side switching element, a positive-side gate drive circuit, a negative-side gate drive circuit, and a gate signal controller. The positive-side switching element is disposed between a positive-side direct-current bus and an output node. The negative-side switching element is disposed between a negative-side direct-current bus and the output node. The positive-side gate drive circuit is configured to turn on and off the positive-side switching element. The negative-side gate drive circuit is configured to turn on and off the negative-side switching element. The gate signal controller is configured to transmit to the positive-side gate drive circuit a gate signal to instruct turning on and off the positive-side switching element and transmit to the negative-side gate drive circuit a gate signal to instruct turning on and off the negative-side switching element. The gate signal includes a first gate signal to temporarily turn on and then turn off the positive-side switching element, and a second gate signal to temporarily turn on and then turn off the negative-side switching element. The gate signal controller is configured to, when a short circuit between the positive-side direct-current bus and the negative-side direct-current bus is detected, transmit the first gate signal to the positive-side gate drive circuit and transmit the second gate signal to the negative-side gate drive circuit.

An aspect of the disclosure provides a vehicle including a motor generator, a power conversion apparatus, a vehicle controller. The motor generator is configured to generate power on a basis of drive of an engine. The power conversion apparatus is configured to supply and receive power to and from the motor generator. The vehicle controller is configured to control the power conversion apparatus. The power conversion apparatus includes a positive-side switching element disposed between a positive-side direct-current bus and an output node, a negative-side switching element disposed between a negative-side direct-current bus and the output node, a positive-side gate drive circuit configured to turn on and off the positive-side switching element, a negative-side gate drive circuit configured to turn on and off the negative-side switching element, and a gate signal controller configured to transmit to the positive-side gate drive circuit a gate signal to instruct turning on and off the positive-side switching element and transmit to the negative-side gate drive circuit a gate signal to instruct turning on and off the negative-side switching element. The gate signal includes a first gate signal to temporarily turn on and then turn off the positive-side switching element and a second gate signal to temporarily turn on and then turn off the negative-side switching element. When a short circuit between the positive-side direct-current bus and the negative-side direct-current bus is detected, the gate signal controller transmits the first gate signal to the positive-side gate drive circuit and transmits the second gate signal to the negative-side gate drive circuit. When either or both of a rear gate and a rear door are open, the vehicle controller causes the power conversion apparatus to stop the motor generator.

An aspect of the disclosure provides a power conversion apparatus including a positive-side switching element, a negative-side switching element, a positive-side gate drive circuit, a negative-side gate drive circuit, and circuitry. The positive-side switching element is disposed between a positive-side direct-current bus and an output node. The negative-side switching element is disposed between a negative-side direct-current bus and the output node. The positive-side gate drive circuit is configured to turn on and off the positive-side switching element. The negative-side gate drive circuit is configured to turn on and off the negative-side switching element. The circuitry is configured to transmit to the positive-side gate drive circuit a gate signal to instruct turning on and off the positive-side switching element and transmit to the negative-side gate drive circuit a gate signal to instruct turning on and off the negative-side switching element. The gate signal includes a first gate signal to temporarily turn on and then turn off the positive-side switching element, and a second gate signal to temporarily turn on and then turn off the negative-side switching element. The circuitry is configured to, when a short circuit between the positive-side direct-current bus and the negative-side direct-current bus is detected, transmit the first gate signal to the positive-side gate drive circuit and transmit the second gate signal to the negative-side gate drive circuit.

BRIEF DESCRIPTION OF THE DRAWINGS

The accompanying drawings are included to provide a further understanding of the disclosure and are incorporated in and constitute a part of this specification. The drawings

FIG. 7 is a flowchart of an operation procedure of a vehicle controller when the vehicle stops.

DETAILED DESCRIPTION

Figure 1:
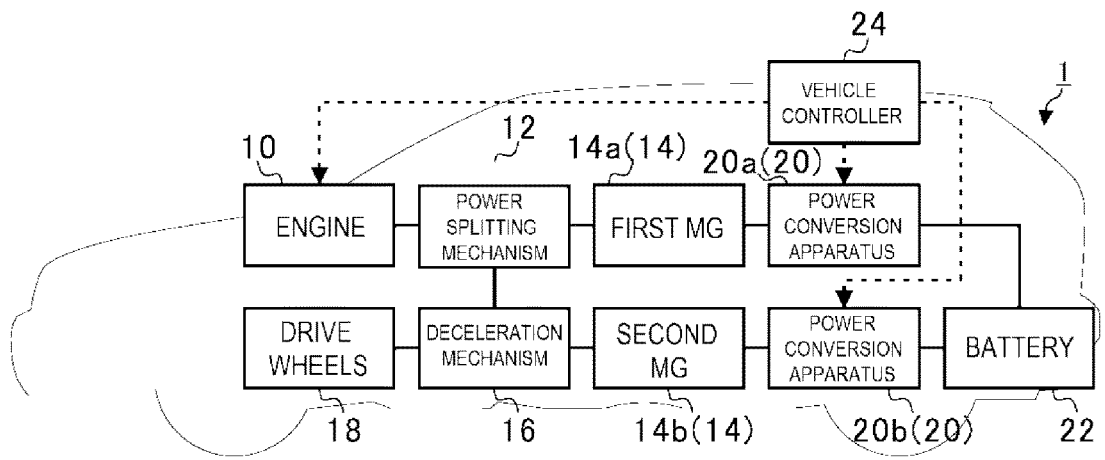
FIG. 1 is a diagram illustrating the configuration of a vehicle according to an embodiment.

In the following, a preferred but non-limiting embodiment of the disclosure is described in detail with reference to the accompanying drawings. Note that sizes, materials, specific values, and any other factors illustrated in the embodiment are illustrative for easier understanding of the disclosure, and are not intended to limit the scope of the disclosure unless otherwise specifically stated. Further, elements in the following example embodiment which are not recited in a most-generic independent claim of the disclosure are optional and may be provided on an as-needed basis. Throughout the present specification and the drawings, elements having substantially the same function and configuration are denoted with the same reference numerals to avoid any redundant description. Further, elements that are not directly related to the disclosure are unillustrated in the drawings. The drawings are schematic and are not intended to be drawn to scale. A power conversion apparatus includes gate drive circuits and a gate signal controller. The gate drive circuits are each provided for each switching element. The gate signal controller transmits to the gate drive circuits gate signals to instruct turning on and off switching elements. In response to the gate signals, the gate drive circuits turn on and off the switching elements.

The gate drive circuits may each includes an insulation transformer to insulate the gate signal controller side and the switching element side from each other. Since the insulation transformer does not transmit a DC component on the primary side to the secondary side, the insulation transformer transmits only rising edges and falling edges of pulse-shaped gate signals to the secondary side. In view of this, the gate drive circuit with the insulation transformer includes a latch circuit on the secondary side of the insulation transformer. Upon receipt of a rising edge, the latch circuit maintains the output in a high state (for example, an "ON" state). Upon receipt of a falling edge, the latch circuit maintains the output in a low state (for example, an "OFF" state).

Static electricity might be applied to the gate drive circuits. For example, it is assumed that a human has touched the power conversion apparatus. In this case, the gate drive circuits may malfunction in spite of a normal gate signal and continue to send an output signal to turn "ON" the switching elements via the latch circuits.

For example, it is assumed that one of a positive-side switching element and a negative-side switching element is turned "ON" and kept "ON" due to a malfunction caused by static electricity. In this case, when the other switching element is turned "ON", a short circuit occurs between the DC buses.

When the switching elements are turned "ON" due to static electricity, it is possible to make the switching elements to recover an "OFF" state by returning the output signal of the gate drive circuits to a normal state because the switching elements themselves have no malfunction.

However, when a short circuit between the DC buses is detected, the gate signal controller cannot distinguish whether the short circuit is caused by a short-circuit malfunction of switching elements or caused by a malfunction due to static electricity. For this reason, when the short circuit between the DC buses is detected, the gate signal controller reacts to the short circuit as a malfunction of the power conversion apparatus irrespective of an actual short-circuit cause. This may result in needless replacement or repairs of the power conversion apparatus even in the case of an abnormality from which the switching elements can recover.

In view of this, it is desirable to provide a power conversion apparatus and a vehicle capable of returning an output signal of a gate drive circuit to a normal state when the gate drive circuit malfunctions due to static electricity.

FIG. 1 is a diagram illustrating the configuration of a vehicle 1 according to the embodiment. The vehicle 1 is, for example, a series-parallel (power-split) hybrid vehicle (hybrid automobile).

The vehicle 1 includes an engine 10, a power splitting mechanism 12, a first motor generator 14a, a second motor generator 14b, a deceleration mechanism 16, drive wheels 18, power conversion apparatuses 20a and 20b, a battery 22, and a vehicle controller 24.

Examples of the engine 10 include a gasoline engine and a diesel engine. The engine 10 is connected with the power splitting mechanism 12. The power splitting mechanism 12 includes, for example, a planetary gear mechanism. The power splitting mechanism 12 is connected with the first motor generator (first MG) 14a and the deceleration mechanism 16 in addition to the engine 10.

The deceleration mechanism 16 includes a plurality of gear mechanisms. The deceleration mechanism 16 is connected with the second motor generator (second MG) 14b. The deceleration mechanism 16 is connected to the drive wheels 18 via elements such as differential gears. The power splitting mechanism 12 splits motive power of the engine 10 into motive power to rotate the first motor generator 14a and motive power to rotate the drive wheels 18.

The first motor generator 14a is connected to the battery 22 through the power conversion apparatus 20a. The first motor generator 14a mainly functions as a generator in accordance with drive of the engine 10. The power conversion apparatus 20a converts alternating-current (AC) power generated by the first motor generator 14a into DC power and supplies the DC power to the battery 22. It should be noted that the first motor generator 14a may function as an electric motor.

The second motor generator 14b is connected to the battery 22 through the power conversion apparatus 20b. At such a timing as acceleration of the vehicle 1, the power conversion apparatus 20b converts DC power supplied from the battery 22 into AC power as desired and supplies the AC power to the second motor generator 14b. At this time, the second motor generator 14b mainly functions as an electric motor and drives the vehicle 1 with the AC power supplied from the power conversion apparatus 20b. It should be noted that at such a timing as deceleration of the vehicle 1, the second motor generator 14b may function as a generator.

The vehicle controller 24 includes a semiconductor integrated circuit including elements such as a central processing unit, a ROM storing programs and the like, and a RAM serving as a work area. The vehicle controller 24 mainly controls drive of the vehicle 1. For example, the vehicle controller 24 controls the engine 10 based on detection results of various sensors (not illustrated). The vehicle controller 24 controls the power conversion apparatuses 20a and 20b to control the first motor generator 14a and the second motor generator 14b.

The power conversion apparatuses 20a and 20b are disposed, for example, below rear seats or below a trunk of the vehicle 1. The power conversion apparatuses 20a and 20b will be hereinafter collectively referred to as power conversion apparatuses 20. The first motor generator 14a and the second motor generator 14b will be collectively referred to as motor generators (MGs) 14.

Figure 2:
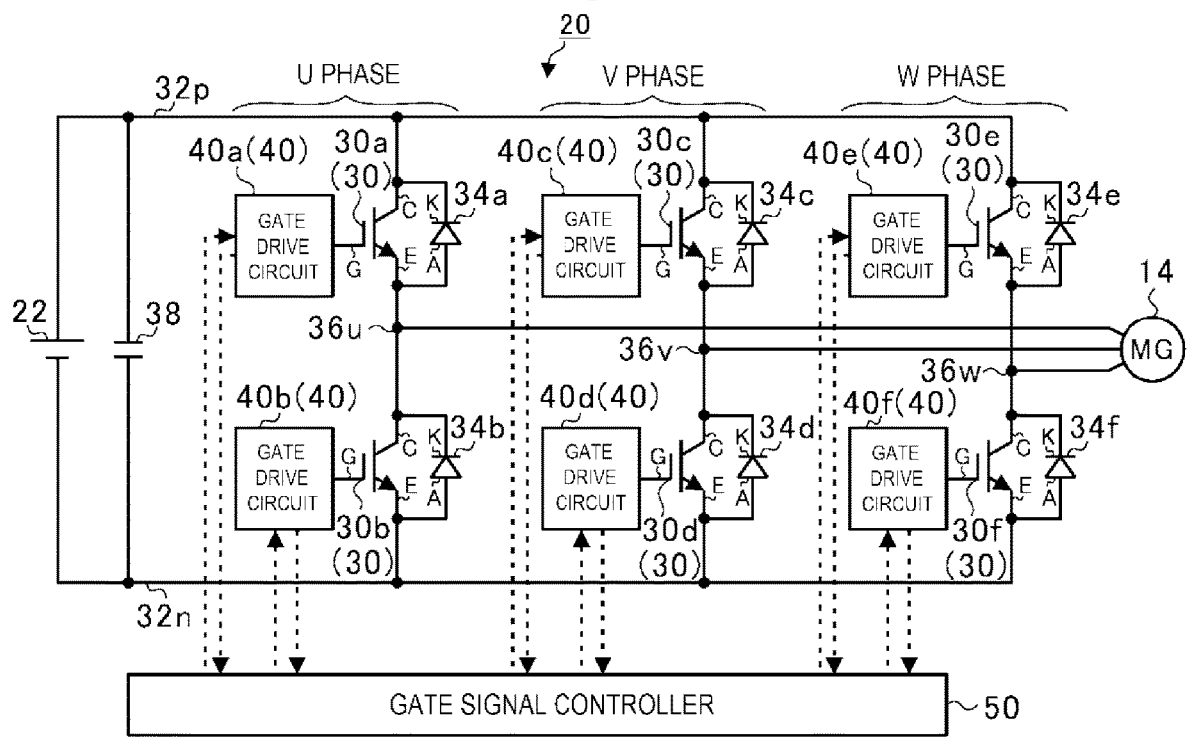
FIG. 2 is a diagram illustrating the configuration of a power conversion apparatus according to the embodiment.

FIG. 2 is a diagram illustrating the configuration of each of the power conversion apparatuses 20 according to the embodiment. The power conversion apparatus 20 includes switching elements 30a, 30b, 30c, 30d, 30e, and 30f, a positive-side DC bus 32p, a negative-side DC bus 32n, flyback diodes 34a, 34b, 34c, 34d, 34e, and 34f, a capacitor 38, gate drive circuits 40a, 40b, 40c, 40d, 40e, and 40f, and a gate signal controller 50.

The switching elements 30a, 30b, 30c, 30d, 30e, and 30f are, for example, insulated gate bipolar transistors (IGBTs). A collector C of the switching element 30a is connected with the positive-side DC bus 32p. An emitter E of the switching element 30a is connected with a collector C of the switching element 30b. An emitter E of the switching element 30b is connected with the negative-side DC bus 32n.

A collector C of the switching element 30c is connected with the positive-side DC bus 32p. An emitter E of the switching element 30c is connected with a collector C of the switching element 30d. An emitter E of the switching element 30d is connected with the negative-side DC bus 32n.

A collector C of the switching element 30e is connected with the positive-side DC bus 32p. An emitter E of the switching element 30e is connected with a collector C of the switching element 30f. An emitter E of the switching element 30f is connected with the negative-side DC bus 32n.

That is, the pair of switching elements 30a and 30b connected in series, the pair of switching elements 30c and 30d connected in series, and the pair of switching elements 30e and 30f connected in series are inserted in parallel between the positive-side DC bus 32p and the negative-side DC bus 32n.

The switching elements 30a, 30b, 30c, 30d, 30e, and 30f may be hereinafter collectively referred to as switching elements 30. Of the switching elements 30, the switching elements 30a, 30c, and 30e may be referred to as positive-side switching elements, and the switching elements 30b, 30d, and 30f may be referred to as negative-side switching elements. "Between the positive-side DC bus 32p and the negative-side DC bus 32n" may be referred to as "between the DC buses".

A cathode K of the flyback diode 34a is connected with the collector C of the switching element 30a, and an anode A of the flyback diode 34a is connected with the emitter E of the switching element 30a. That is, the flyback diode 34a is connected in antiparallel to the switching element 30a. Similarly, the flyback diodes 34b, 34c, 34d, 34e, and 34f are respectively connected in antiparallel to the switching elements 30b, 30c, 30d, 30e, and 30f.

A connection node between the emitter E of the switching element 30a and the collector C of the switching element 30b functions as a U-phase output node 36u. Similarly, a connection node between the emitter E of the switching element 30c and the collector C of the switching element 30d functions as a V-phase output node 36v, and a connection node between the emitter E of the switching element 30e and the collector C of the switching element 30f functions as a W-phase output node 36w.

The positive-side DC bus 32p is connected with the positive electrode of the battery 22, and the negative-side DC bus 32n is connected with the negative electrode of the battery 22. The capacitor 38 is inserted between the DC buses. The capacitor 38 smooths voltage between the DC buses.

The gate drive circuit 40a is connected with a gate G of the switching element 30a and turns on and off the switching element 30a. Similarly, the gate drive circuit 40b is connected with a gate G of the switching element 30b and turns on and off the switching element 30b. The gate drive circuit 40c is connected with a gate G of the switching element 30c and turns on and off the switching element 30c. The gate drive circuit 40d is connected with a gate G of the switching element 30d and turns on and off the switching element 30d. The gate drive circuit 40e is connected with a gate G of the switching element 30e and turns on and off the switching element 30e. The gate drive circuit 40f is connected with a gate G of the switching element 30f and turns on and off the switching element 30f.

The gate drive circuits 40a and 40b detect whether a short circuit occurs between the DC buses via the U-phase switching elements 30a and 30b, and transmits a short-circuit signal indicating either the presence or absence of the short circuit to the gate signal controller 50. The gate drive circuits 40c and 40d detect whether a short circuit occurs between the DC buses via the V-phase switching elements 30c and 30d, and transmit a short-circuit signal indicating either the presence or absence of the short circuit to the gate signal controller 50. The gate drive circuits 40e and 40f detect whether a short circuit occurs between the DC buses via the W-phase switching elements 30e and 30f, and transmit a short-circuit signal indicating either the presence or absence of the short circuit to the gate signal controller 50.

The gate drive circuits 40a, 40b, 40c, 40d, 40e, and 40f may be hereinafter collectively referred to as gate drive circuits 40. Of the gate drive circuits 40, the gate drive circuits 40a, 40c, and 40e may be referred to as positive-side gate drive circuits, and the gate drive circuits 40b, 40d, and 40f will be referred to as negative-side gate drive circuits.

The gate signal controller 50 includes a semiconductor integrated circuit including elements such as a central processing unit, a ROM storing programs and the like, and a RAM serving as a work area. Under control of the vehicle controller 24, the gate signal controller 50 generates gate signals to instruct turning on and off the switching elements 30 and transmits the generated gate signals to the gate drive circuits 40. The gate signals are, for example, pulse-shaped signals.

The gate signal controller 50 receives the short-circuit signal from the gate drive circuits 40. When the short-circuit signal is "OFF", it is indicated that there is no short circuit between the DC buses. When the short-circuit signal is "ON", it is indicated that a short circuit has occurred between the DC buses.

Figure 3:
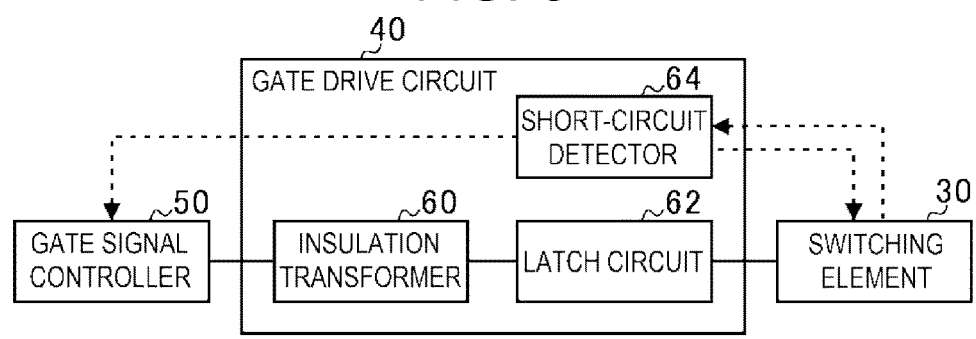
FIG. 3 is a diagram illustrating the configuration of a gate drive circuit.

FIG. 3 is a diagram illustrating the configuration of each of the gate drive circuits 40. The gate drive circuit 40 includes an insulation transformer 60, a latch circuit 62, and a short-circuit detector 64.

The primary side of the insulation transformer 60 is connected with the gate signal controller 50, and the secondary side of the insulation transformer 60 is connected with the latch circuit 62. The latch circuit 62 is connected with the switching element 30.

The insulation transformer 60 insulates the primary side and the secondary side from each other. Since the insulation transformer 60 does not transmit a DC component on the primary side to the secondary side, the insulation transformer 60 transmits only rising edges and falling edges of pulse-shaped gate signals to the secondary side.

Upon receipt of a rising edge, the latch circuit 62 maintains the output in a high state (for example, anon state). Upon receipt of a falling edge, the latch circuit 62 maintains the output in a low state (for example, an off state). Thus, the latch circuit 62 outputs to the switching element 30 pulse-shaped output signals based on the input rising edges and falling edges.

The short-circuit detector 64 determines whether current of the switching element 30 is overcurrent so as to detect a short circuit between the DC buses via the switching element 30. When detecting a short circuit, the short-circuit detector 64 continues to transmit a short-circuit signal "ON" to the gate signal controller 50 for a predetermined period of time after detecting the short circuit.

When the predetermined period of time has elapsed, the short-circuit detector 64 changes the short-circuit signal "ON" to "OFF" and continues to transmit the short-circuit signal "OFF" to the gate signal controller 50 until detecting a short circuit next. In this manner, the short-circuit detector 64 continues to transmit the short-circuit signal "ON" for the predetermined period of time, so that the gate signal controller 50 can more reliably receive the short-circuit signal "ON".

Moreover, when detecting a short circuit, the short-circuit detector 64 transmits a compulsive signal to compulsively turn off the switching element 30 to the switching element 30.

The power conversion apparatuses 20, along with such elements as the battery 22 and a DC/DC converter, is accommodated in a metallic case. This case is disposed, for example, below the trunk of the vehicle 1. Although covered with a non-metallic material such as plastics and disposed below the trunk, part (metallic part) of the case is unfortunately exposed for a structural reason.

For example, in opening a rear gate of the vehicle 1 and reaching a hand into the trunk, a human may accidentally touch the exposed metallic part of the case containing the power conversion apparatuses 20. When the human touches the metallic part, static electricity may be applied to the case, through which static electricity may be transmitted to the gate drive circuit 40 of the power conversion apparatuses 20.

In this case, the gate drive circuit 40 may malfunction in spite of a normal gate signal and continue to transmit an output signal to turn "ON" the switching element 30 via the latch circuit 62.

For example, when one of a positive-side switching element and a negative-side switching element is turned "ON" and kept "ON" due to a malfunction caused by static electricity, and when the other switching element 30 is turned "ON", a short circuit occurs between the DC buses.

In the case of a malfunction due to static electricity, it is possible to make the switching elements 30 recover an "OFF" state by returning the output signal of the gate drive circuits 40 to a normal state because the switching elements 30 themselves have no malfunction.

In view of this, when the short circuit between the DC buses is detected, the gate signal controller 50 transmits a first gate signal to temporarily turn on and then turn off the positive-side switching element to the positive-side gate drive circuit and transmits a second gate signal to temporarily turn on and then turn off the negative-side switching element to the negative-side gate drive circuit. The power conversion apparatuses 20 use falling edges of the first gate signal and falling edges of the second gate signal to return the output signal of the gate drive circuits 40 to the normal state.

Figure 4:
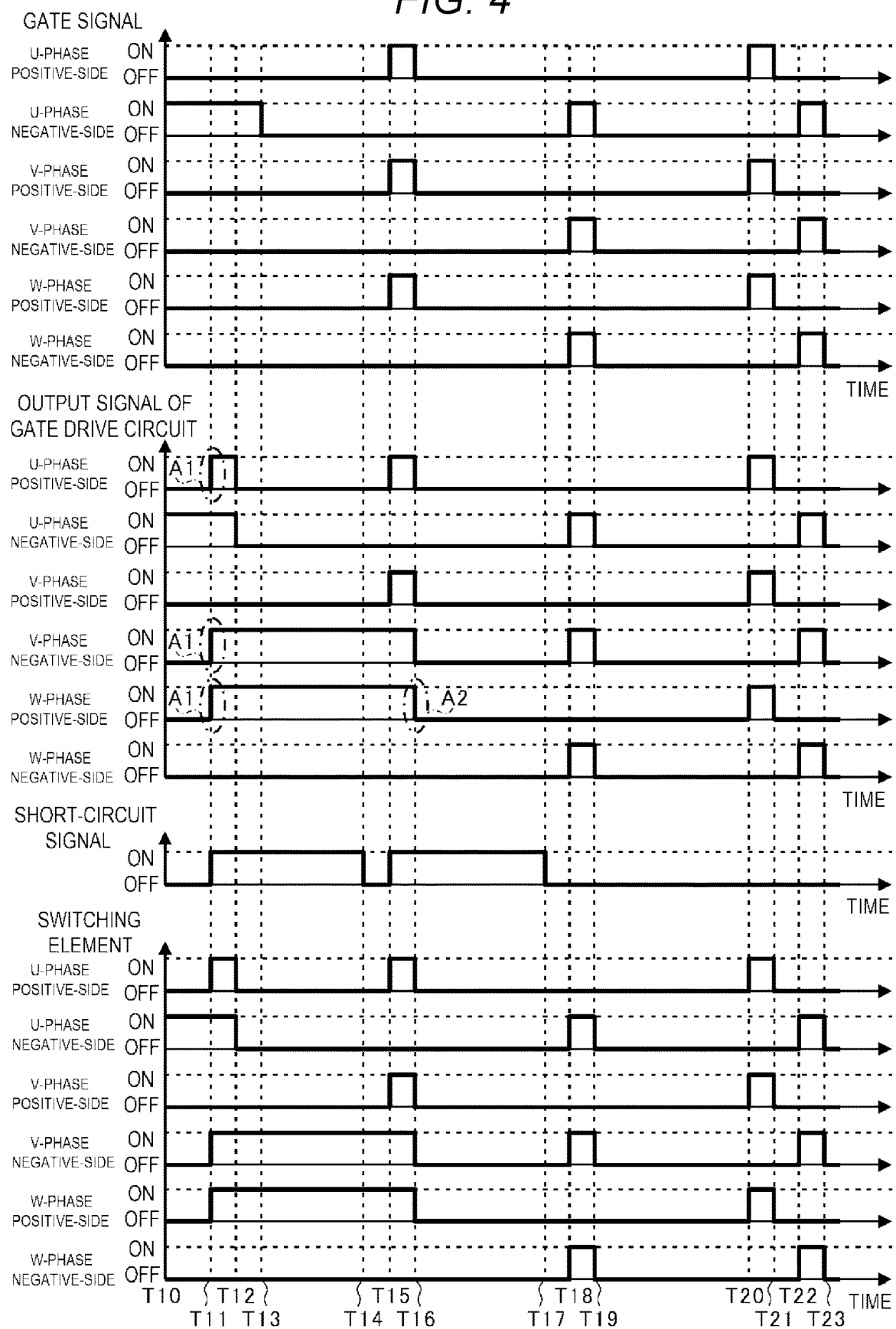
FIG. 4 is a time chart illustrating operation of the power conversion apparatus when static electricity is applied.

FIG. 4 is a time chart illustrating operation of each of the power conversion apparatuses 20 when static electricity is applied. The short-circuit signal illustrated in FIG. 4 indicates a logical sum of short-circuit signals transmitted from the gate drive circuits 40.

For example, at time T10, the gate signal controller 50 is transmitting a gate signal "ON" to the U-phase negative-side gate drive circuit 40b and a gate signal "OFF" to the other gate drive circuits 40a, 40c, 40d, 40e, and 40f.

It is assumed that at time T11 after the time T10, an output signal of the U-phase positive-side gate drive circuit 40a, an output signal of the V-phase negative-side gate drive circuit 40d, and an output signal of the W-phase positive-side gate drive circuit 40e become "ON" due to static electricity, as indicated by circles A1 of single chain lines, in spite of the gate signals. As a result, the U-phase positive-side switching element 30a, the V-phase negative-side switching element 30d, and the W-phase positive-side switching element 30e are turned "ON".

At the time T11, since the U-phase negative-side switching element 30b is in the "ON" state, a short circuit occurs between the DC buses via the U-phase switching elements 30a and 30b. At this time, the U-phase gate drive circuits 40a and 40b transmit the short-circuit signal "ON" to the gate signal controller 50. Transmission of the short-circuit signal "ON" is maintained for the predetermined period of time (for example, until time T14).

At time T12 after the time T11, the U-phase gate drive circuits 40a and 40b transmit the compulsive signal to the U-phase switching elements 30a and 30b to turn "OFF" the switching elements 30a and 30b. Transmission of the compulsive signal is maintained for the predetermined period of time (for example, until time T14) in a similar manner to the transmission of the short-circuit signal "ON". Thus, the switching element 30a corresponding to the U-phase positive-side gate drive circuit 40a that has malfunctioned due to the static electricity is returned to an "OFF" state.

At time T13 after the time T12, the gate signal controller 50 that has received the short-circuit signal "ON" changes the gate signal to "OFF" to transmit to the U-phase gate drive circuits 40a and 40b that have been transmitting the short-circuit signal "ON".

At the time T11, since the V-phase positive-side switching element 30c is in an "OFF" state, no short circuit occurs via the V phase. At this time, the V-phase negative-side gate drive circuit 40d to which static electricity has been applied continues to send the output signal "ON" via the latch circuit 62. Consequently, the switching element 30d is maintained in the "ON" state.

At the time T11, since the W-phase negative-side switching element 30f is in an "OFF" state, no short circuit occurs via the W phase. At this time, the W-phase positive-side gate drive circuit 40e to which static electricity has been applied continues to send the output signal "ON" via the latch circuit 62. Consequently, the switching element 30e is maintained in the "ON" state.

At the time T14 after the time T13, the U-phase gate drive circuits 40a and 40b make the short-circuit signal "OFF" because the predetermined period of time has elapsed.

At time T15 after the time T14, the gate signal controller 50 transmits the gate signal "ON" to the U-phase positive-side gate drive circuit 40a, the V-phase positive-side gate drive circuit 40c, and the W-phase positive-side gate drive circuit 40e. Then, at time T16 immediately after the time T15, the gate signal controller 50 transmits the gate signal "OFF" to the U-phase positive-side gate drive circuit 40a, the V-phase positive-side gate drive circuit 40c, and the W-phase positive-side gate drive circuit 40e. In other words, from the time T15 to the time T16, the gate signal controller 50 transmits the first gate signal.

During a period in which the gate drive circuits 40 transmit the short-circuit signal "ON", the gate drive circuits 40 transmit the compulsive signal without receiving the gate signals. In view of this, the power conversion apparatus 20 has a time interval from transmission of the short-circuit signal "ON" (from the time T11) to transmission of the first gate signal (to the time T15) longer than transmission continuation time of the short-circuit signal "ON".

Consequently, even when the short-circuit signal is "ON", the first gate signal subsequently transmitted reaches the gate drive circuits 40 after the short-circuit signal becomes "OFF". This enables the gate drive circuits 40 to appropriately receive the first gate signal.

At the time T15, since the V-phase negative-side switching element 30d is in the "ON" state under an influence of static electricity, a short circuit occurs between the DC buses via the V-phase switching elements 30c and 30d. At this time, the V-phase gate drive circuits 40c and 40d transmit the short-circuit signal "ON" to the gate signal controller 50. Transmission of the short-circuit signal "ON" is maintained for a predetermined period of time (for example, until time T17).

At time T16, the V-phase gate drive circuits 40c and 40d transmit the compulsive signal to the V-phase switching elements 30c and 30d to turn "OFF" the switching elements 30c and 30d. Transmission of the compulsive signal is maintained for a predetermined period of time (for example, until the time T17) in a similar manner to the transmission of the short-circuit signal "ON". Thus, the switching element 30d corresponding to the V-phase negative-side gate drive circuit 40d that has been made malfunction by static electricity is returned to an "OFF" state.

At the time T15, since the W-phase negative-side switching element 30f is in an "OFF" state, no short circuit occurs via the W phase. Therefore, at the time T15, the W-phase positive-side gate drive circuit 40e continues to send the output signal "ON".

Then, at the time T16, the gate signal transmitted to the W-phase positive-side gate drive circuit 40e is changed from "ON" to "OFF" to input the falling edge to the W-phase positive-side gate drive circuit 40e. This changes the output of the W-phase positive-side latch circuit 62 from a high state to a low state to make the output signal of the W-phase positive-side gate drive circuit 40e "OFF" as indicated by a circle A2 of a single chain line. As a result, the switching element 30e corresponding to the W-phase positive-side gate drive circuit 40e that has been made malfunction by static electricity is returned to an "OFF" state.

At time the T17 after the time T16, the V-phase gate drive circuits 40c and 40d make the short-circuit signal "OFF" because the predetermined period of time has elapsed.

At time T18 that follows the time T17 and that is after a predetermined period of time has elapsed since the transmission of the first gate signal, the gate signal controller 50 transmits the gate signal "ON" to the U-phase negative-side gate drive circuit 40b, the V-phase negative-side gate drive circuit 40d, and the W-phase negative-side gate drive circuit 40f. Then, at time T19 immediately after the time T18, the gate signal controller 50 transmits the gate signal "OFF" to the U-phase negative-side gate drive circuit 40b, the V-phase negative-side gate drive circuit 40d, and the W-phase negative-side gate drive circuit 40f. In other words, from the time T18 to the time T19, the gate signal controller 50 transmits the second gate signal.

The power conversion apparatus 20 has a time interval from the transmission of the first gate signal (from the time T15) to the transmission of the second gate signal (to the time T18) longer than transmission continuation time of the short-circuit signal "ON". Consequently, even when the short-circuit signal becomes "ON" at the time of transmitting the first gate signal, the gate drive circuits 40 can appropriately receive the second gate signal.

In the example illustrated in FIG. 4, all of the switching elements 30 corresponding to all of the gate drive circuits 40 that have been made malfunction by static electricity are returned to the normal state prior to the time T18. Therefore, in the example illustrated in FIG. 4, there are no switching elements 30 that are made recover anew by the transmission of the second gate signal.

When static electricity is applied, it is difficult to identify which of the gate drive circuits 40 malfunction in advance, and more than one of the gate drive circuits 40 may simultaneously malfunction. For this reason, the power conversion apparatus 20 transmits the first gate signal and the second gate signal to return all of the gate drive circuits 40 to the normal state. Specifically, the power conversion apparatus 20 uses the first gate signal to make the positive-side gate drive circuits recover the normal state and uses the second gate signal to make the negative-side gate drive circuits recover the normal state.

When a short circuit between the DC buses is detected, the gate drive circuits 40 transmit the compulsive signal to the switching elements 30. It is feared that the gate drive circuits 40 may have an abnormality of transmitting no compulsive signal upon detection of the short circuit between the DC buses. In this case, referring to FIG. 4, the output signal of the U-phase negative-side gate drive circuit 40b and the output signal of the V-phase negative-side gate drive circuit 40d are maintained in the "ON" state until the time T19. However, at the time T19, the power conversion apparatus 20 uses falling edges of the second gate signal to change the output signal of the U-phase negative-side gate drive circuit 40b and the output signal of the V-phase negative-side gate drive circuit 40d to "OFF". That is, even in the case of the abnormality of transmitting no compulsive signal, the power conversion apparatus 20 more reliably enables the gate drive circuits 40 and the switching elements 30 to recover.

It should be noted that transmission of the second gate signal at the time T18 may be omitted. In this case, as compared with the case of transmitting the second gate signal, recovery of the negative-side gate drive circuits decreases in reliability. However, processing time for the recovery can be reduced.

At time T20 after the time T19, the gate signal controller 50 transmits the gate signal "ON" to the U-phase positive-side gate drive circuit 40a, the V-phase positive-side gate drive circuit 40c, and the W-phase positive-side gate drive circuit 40e. Then, at time T21 immediately after the time T20, the gate signal controller 50 transmits the gate signal "OFF" to the U-phase positive-side gate drive circuit 40a, the V-phase positive-side gate drive circuit 40c, and the W-phase positive-side gate drive circuit 40e. In other words, from the time T20 to the time T21, the gate signal controller 50 transmits the first gate signal again.

The power conversion apparatus 20 has a time interval from transmission of the second gate signal (from the time T18) to the second transmission of the first gate signal (to the time T20) longer than transmission continuation time of the short-circuit signal "ON". Consequently, even when the short-circuit signal becomes "ON" at the time of transmitting the second gate signal, the gate drive circuits 40 can appropriately receive the first gate signal for the second time.

Next, at time T22 after the time T21, the gate signal controller 50 transmits the gate signal "ON" to the U-phase negative-side gate drive circuit 40b, the V-phase negative-side gate drive circuit 40d, and the W-phase negative-side gate drive circuit 40f. Then, at time T23 immediately after the time T22, the gate signal controller 50 transmits the gate signal "OFF" to the U-phase negative-side gate drive circuit 40b, the V-phase negative-side gate drive circuit 40d, and the W-phase negative-side gate drive circuit 40f. In other words, from the time T22 to the time T23, the gate signal controller 50 transmits the second gate signal again.

The second transmission of the first gate signal from the time T20 to the time T21 and the second transmission of the second gate signal from the time T22 to the time T23 are performed to distinguish (identify) whether the short circuit between the DC buses is caused by static electricity or caused by the short-circuit malfunction of the switching elements 30.

When the short circuit between the DC buses is caused by static electricity, transmission of the first gate signal and transmission of the second gate signal are each performed once to enable the switching elements 30 to recover the "OFF" state. However, when the short circuit between the DC buses is caused by the short-circuit malfunction of the switching elements 30, the switching elements 30 cannot be made recover the "OFF" state even by transmitting each of the first gate signal and the second gate signal once.

In view of this, the gate signal controller 50 alternately repeats transmission of the first gate signal and transmission of the second gate signal a plurality of times (for example, twice). When a short circuit between the DC buses is detected again after the gate signal controller 50 transmits the first gate signal for the second or subsequent time, the gate signal controller 50 determines that at least one of the negative-side switching elements has a short-circuit malfunction. When a short circuit between the DC buses is detected again after the gate signal controller 50 transmits the second gate signal for the second or subsequent time, the gate signal controller 50 determines that at least one of the positive-side switching elements has a short-circuit malfunction.

In the example illustrated in FIG. 4, in both of the second transmission of the first gate signal (at the time T20) and the second transmission of the second gate signal (at the T22), the short-circuit signal is "OFF". Consequently, in the example illustrated in FIG. 4, none of the switching elements 30 has a short-circuit malfunction. That is, in this case, it can be distinguished that the short circuit at time T11 has been caused by static electricity.

The power conversion apparatus 20 has a time interval from the second transmission of the first gate signal (from the time T20) to the second transmission of the second gate signal (to the time T22) shorter than the transmission continuation time of the short-circuit signal "ON". This reduces processing time as compared with the case where the power conversion apparatus 20 has the time interval from the second transmission of the first gate signal to the second transmission of the second gate signal longer than the transmission continuation time of the short-circuit signal ON".

In this case, when the short-circuit signal becomes "ON" at the time of the second transmission of the first gate signal, the gate drive circuits 40 do not receive the second transmission of the second gate signal. However, concerning a short-circuit malfunction of the switching elements 30, there is no need to specify the position of switching elements 30 having the short-circuit malfunction. It suffices that the presence of the short-circuit malfunction in any of the switching elements 30 can be distinguished. That is, when the short-circuit signal becomes "ON" at the time of the second transmission of the first gate signal, it can be distinguished then that the short-circuit malfunction has arisen in the switching elements 30. Consequently, there is practically no disadvantage even when the second transmission of the second gate signal cannot be received.

Figure 5:
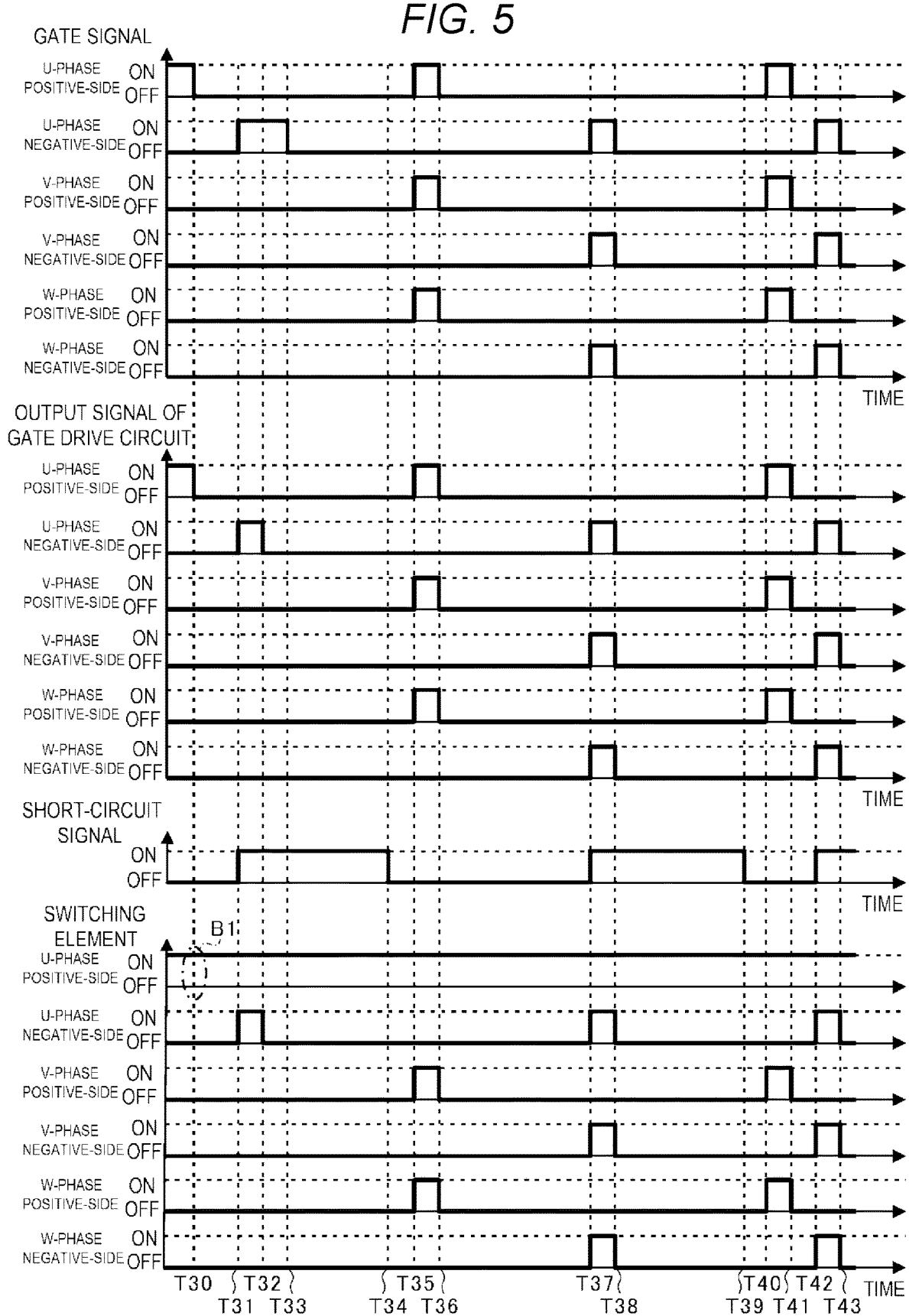
FIG. 5 is a time chart illustrating operation of the power conversion apparatus when a switching element has a short-circuit malfunction.

FIG. 5 is a time chart illustrating operation of each of the power conversion apparatuses 20 when the switching element 30 has a short-circuit malfunction. The short-circuit signal illustrated in FIG. 5 indicates a logical sum of short-circuit signals transmitted from the gate drive circuits 40.

For example, it is assumed that at time T30, the gate signal controller 50 changes the gate signal from "ON" to "OFF" to transmit to the U-phase positive-side gate drive circuit 40a. It is also assumed that at this time, as indicated by a circle B1 of a single chain line, the U-phase positive-side switching element 30a is fixed in the "ON" state and has a short-circuit malfunction. That is, the U-phase positive-side switching element 30a does not become "OFF" but is maintained "ON" at and after the time T30.

At time T31 after the time T30, when the U-phase negative-side switching element 30b is turned "ON", a short circuit occurs between the DC buses via the U-phase switching elements 30a and 30b. At this time, the U-phase gate drive circuits 40a and 40b transmit the short-circuit signal "ON" to the gate signal controller 50.

At time T32 after the time T31, the U-phase positive-side gate drive circuit 40a transmits the compulsive signal to the switching element 30a, and the U-phase negative-side gate drive circuit 40b transmits the compulsive signal to the switching element 30b. In response to the compulsive signal, the switching element 30b is turned "OFF". However, because the switching element 30a has the short-circuit malfunction, the switching element 30a does not become "OFF" but is maintained "ON".

At time T33 after the time T32, the gate signal controller 50 that has received the short-circuit signal "ON" changes the gate signal to "OFF" to transmit to the U-phase negative-side gate drive circuit 40b. At time T34 after the time T33, the U-phase gate drive circuits 40a and 40b make the short-circuit signal "OFF".

From time T35 to time T36 after the time T34, the gate signal controller 50 performs first transmission of the first gate signal. At this time, no short circuit occurs between the DC buses in any of the U phase, the V phase, and the W phase.

From time T37 to T38 after a predetermined period of time has elapsed since transmission of the first gate signal, the gate signal controller 50 performs first transmission of the second gate signal. At this time, since the U-phase positive-side switching element 30a is in the "ON" state, a short circuit occurs between the DC buses via the U-phase switching elements 30a and 30b. The U-phase gate drive circuits 40a and 40b transmit the short-circuit signal "ON" to the gate signal controller 50.

At time T39 after the time T38, the U-phase gate drive circuits 40a and 40b make the short-circuit signal "OFF" because a predetermined period of time has elapsed.

From time T40 to T41 after the time T39 and after a predetermined period of time has elapsed from transmission of the second gate signal, the gate signal controller 50 performs second transmission of the first gate signal. At this time, no short circuit occurs between the DC buses in any of the U phase, the V phase, and the W phase.

From time T42 to T43 after a predetermined period of time has elapsed since the second transmission of the first gate signal, the gate signal controller 50 performs second transmission of the second gate signal. At this time, since the U-phase positive-side switching element 30a is in the "ON" state, a short circuit occurs between the DC buses via the U-phase switching elements 30a and 30b. The U-phase gate drive circuits 40a and 40b transmit the short-circuit signal "ON" to the gate signal controller 50.

Since the gate signal controller 50 receives the short-circuit signal "ON" after the second transmission of the second gate signal, the gate signal controller 50 determines that any of the positive-side switching elements has a short-circuit malfunction. In this manner, the power conversion apparatus 20 can distinguish whether the short circuit between the DC buses is caused by static electricity or by the short-circuit malfunction of the switching elements 30.

Figure 6:
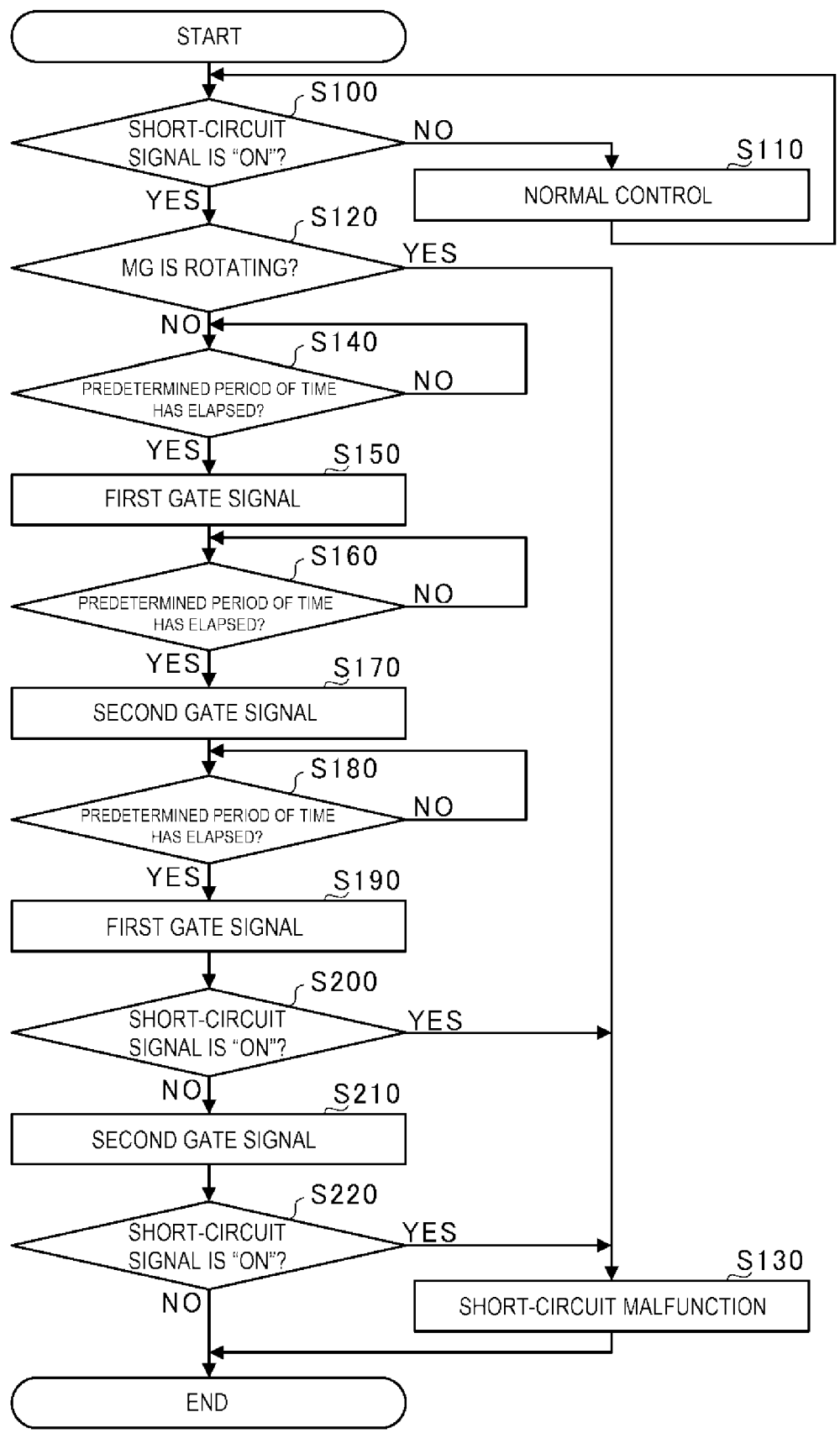
FIG. 6 is a flowchart of an operation procedure of a gate signal controller of the power conversion apparatus.

FIG. 6 is a flowchart of an operation procedure of the gate signal controller 50 of the power conversion apparatus 20. The power conversion apparatus 20 described with reference to FIG. 6 is, for example, the power conversion apparatus 20b connected with the second motor generator 14b.

The gate signal controller 50 determines whether the short-circuit signal from the gate drive circuits 40 is "ON" (S100). When the short-circuit signal is not "ON", that is, when the short-circuit signal is "OFF" (NO at S100), the gate signal controller 50 performs normal control (S110) and repeats processing of step S100. It should be noted that in the normal control, the gate signal controller 50 generates gate signals in accordance with control by the vehicle controller 24 and transmits the generated gate signals to the gate drive circuits 40.

When the short-circuit signal is "ON" (YES at S100), the gate signal controller 50 determines whether the motor generator 14 (for example, the second motor generator 14b) is rotating (S120). It should be noted that rotation of each of the motor generators 14 may be detected by an encoder disposed at a rotation shaft of the motor generator 14 and may be detected based on a current between the motor generator 14 and the power conversion apparatus 20.

When the motor generator 14 is rotating (YES at S120), the gate signal controller 50 performs neither transmission of the first gate signal nor transmission of the second gate signal, determines that any of the switching elements 30 have a short-circuit malfunction, and transmits a signal to that effect to the vehicle controller 24 (S130), and then ends the series of processing. That is, when the motor generator 14 is rotating, the gate signal controller 50 does not distinguish a cause of the short circuit between the DC buses.

When switching (normal control) of the power conversion apparatus 20 is stopped during rotation of the motor generator 14 (the second motor generator 14b) as an electric motor, drive torque drastically decreases to make behavior of the vehicle 1 unstable. In view of this, the power conversion apparatus 20 performs neither transmission of the first gate signal nor transmission of the second gate signal when the motor generator 14 is rotating.

In response to the signal to the effect that the short-circuit malfunction has occurred in the switching elements 30, the vehicle controller 24 stops the second motor generator 14b and changes the drive mode to failsafe traveling only by use of the engine 10.

When the motor generator 14 is not rotating, that is, when the motor generator 14 stops (NO at S120), the gate signal controller 50 determines whether the predetermined period of time has elapsed since receiving the short-circuit signal "ON" (S140). When the predetermined period of time has not elapsed (NO at S140), the gate signal controller 50 stands by until the predetermined period of time elapses.

When the predetermined period of time has elapsed (YES at S140), the gate signal controller 50 transmits the first gate signal to the gate drive circuits 40 (S150). Specifically, the gate signal controller 50 transmits the gate signal "ON" to the positive-side gate drive circuits in parallel, and immediately after that, the gate signal controller 50 transmits the gate signal "OFF" to the positive-side gate drive circuits in parallel. It should be noted that a time interval between the gate signals "ON" and "OFF" at this time is set, for example, to the minimum time that allows the gate drive circuits 40 to appropriately recognize the gate signals as pulse signals.

Next, the gate signal controller 50 determines whether a predetermined period of time has elapsed since the transmission of the first gate signal (S160). When the predetermined period of time has not elapsed (NO at S160), the gate signal controller 50 stands by until the predetermined period of time elapses.

When the predetermined period of time has elapsed (YES at S160), the gate signal controller 50 transmits the second gate signal to the gate drive circuits 40 (S170). Specifically, the gate signal controller 50 transmits the gate signal "ON" to the negative-side gate drive circuits in parallel, and immediately after that, the gate signal controller 50 transmits the gate signal "OFF" to the negative-side gate drive circuits in parallel. It should be noted that a time interval between the gate signals "ON" and "OFF" at this time is set, for example, to the minimum time that allows the gate drive circuits 40 to appropriately recognize the gate signals as pulse signals.

Next, the gate signal controller 50 determines whether a predetermined period of time has elapsed since the transmission of the second gate signal (S180). When the predetermined period of time has not elapsed (NO at S180), the gate signal controller 50 stands by until the predetermined period of time elapses.

When the predetermined period of time has elapsed (YES at S180), the gate signal controller 50 transmits the first gate signal for the second time (S190). Specifically, the gate signal controller 50 transmits the gate signal "ON" to the positive-side gate drive circuits in parallel, and immediately after that, the gate signal controller 50 transmits the gate signal "OFF" to the positive-side gate drive circuits in parallel.

Next, the gate signal controller 50 determines whether the short-circuit signal "ON" is received again within a predetermined period of time after the second transmission of the first gate signal (S200). When the short-circuit signal "ON" is received (YES at S200), the gate signal controller 50 determines that any of the negative-side switching elements has a short-circuit malfunction and transmits a signal to that effect to the vehicle controller 24 (S130), then ending the series of processing. Then, the vehicle controller 24 stops the second motor generator 14b to change to the failsafe traveling.

When the short-circuit signal "ON" is not received (NO at S200), the gate signal controller 50 transmits the second gate signal for the second time (S210). Specifically, the gate signal controller 50 transmits the gate signal "ON" to the negative-side gate drive circuits in parallel, and immediately after that, the gate signal controller 50 transmits the gate signal "OFF" to the negative-side gate drive circuits in parallel.

Next, the gate signal controller 50 determines whether the short-circuit signal "ON" is received again within a predetermined period of time after the second transmission of the second gate signal (S220). When the short-circuit signal "ON" is received (YES at S220), the gate signal controller 50 determines that any of the positive-side switching elements has a short-circuit malfunction and transmits a signal to that effect to the vehicle controller 24 (S130), then ending the series of processing. Then, the vehicle controller 24 stops the second motor generator 14b to change to the failsafe traveling.

When the short-circuit signal "ON" is not received (NO at S220), the gate signal controller 50 determines that the short circuit is caused by static electricity and that the gate drive circuits 40 and the switching elements 30 have recovered the normal state, and then ends the series of processing. In this case, the vehicle controller 24 does not shift to the failsafe traveling but maintains the present drive mode.

In this manner, the gate signal controller 50 transmits the first gate signal and the second gate signal only when the motor generator 14 (the second motor generator 14b) stops.

Since the second motor generator 14b is a drive source of the vehicle 1, the vehicle 1 is traveling while the second motor generator 14b is rotating. While the vehicle 1 is traveling, an operator on board (a human) may touch the power conversion apparatuses 20 but is very unlikely to.

Even when the vehicle 1 stops, the first motor generator 14a may rotate to generate power. Moreover, when the vehicle 1 stops, there is a higher possibility that a human accesses a trunk of the vehicle 1 and touches the power conversion apparatuses 20 than while the vehicle 1 is traveling. That is, while the first motor generator 14a is rotating, there is a higher possibility that static electricity is applied to the power conversion apparatuses 20 than while the second motor generator 14b is rotating.

In view of this, when a short circuit occurs between the DC buses due to a malfunction caused by static electricity, the power conversion apparatus 20a connected with the first motor generator 14a may also transmit the first gate signal and the second gate signal to return the switching elements 30 to the "OFF" state in a similar manner to the procedure in FIG. 6.

When switching (normal control) of the power conversion apparatus 20 is stopped during rotation of the first motor generator 14a as a generator, it is feared that voltage induced by the first motor generator 14a cannot be controlled, so that regenerative current, which is overcurrent, may be input to the battery 22, thereby damaging the battery 22.

Basically, the first motor generator 14a is not used to drive the vehicle 1. Consequently, no disadvantageous situation arises even when the first motor generator 14a rotating as the generator is stopped.

In view of this, the vehicle 1 makes the first motor generator 14a stopped in advance when there is a high possibility that a human touches the power conversion apparatus 20a connected with the first motor generator 14a (for example, when a rear gate or a rear door is open).

FIG. 7 is a flowchart of an operation procedure of the vehicle controller 24 when the vehicle 1 stops. Although not illustrated in FIG. 1, the vehicle 1 includes a rear door sensor to detect opening and closing of rear doors and a rear gate sensor to detect opening and closing of a rear gate. When a rear door is open, the rear door sensor transmits a rear door signal "ON" to the vehicle controller 24. When the rear gate is open, the rear gate sensor transmits a rear gate signal "ON" to the vehicle controller 24.

Referring to FIG. 7, the vehicle controller 24 determines whether either or both of the rear door signal and the rear gate signal are "ON" (S300).

When neither of the rear door signal nor the rear gate signal is "ON" (NO at S300), the vehicle controller 24 ends the series of processing.

When either or both of the rear door signal and the rear gate signal are "ON" (YES at S300), the vehicle controller 24 determines whether the first motor generator 14a is rotating (S310). When the first motor generator 14a is not rotating, that is, when the first motor generator 14a stops (NO at S310), the vehicle controller 24 ends the series of processing and keeps the first motor generator 14a stopped.

When the first motor generator 14a is rotating (YES at S310), the vehicle controller 24 stops the first motor generator 14a (S320) and ends the series of processing.

In this manner, when the rear gate or the rear door is open, the vehicle 1 makes the first motor generator 14a stopped in advance. Consequently, in the vehicle 1, even when static electricity is applied to the power conversion apparatus 20a connected with the first motor generator 14a, the first gate signal and the second gate signal can be transmitted with the first motor generator 14a being stopped. As a result, in the vehicle 1, the battery 22 can be prevented from being damaged.

As described above, when a short circuit between the DC buses is detected, the gate signal controller 50 of each of the power conversion apparatuses 20 according to the embodiment transmits the first gate signal to temporarily turn on and then turn off the positive-side switching element to the positive-side gate drive circuit and transmits the second gate signal to temporarily turn on and then turn off the negative-side switching element to the negative-side gate drive circuit.

Therefore, when the gate drive circuits 40 malfunction due to static electricity, the power conversion apparatus 20 according to the embodiment can return the output signal of the gate drive circuits 40 to the normal state. This enables the power conversion apparatus 20 according to the embodiment to return the switching elements 30 to the "OFF" state and to avoid erroneous determination that the abnormality is caused by the short-circuit malfunction of the switching elements 30.

The gate signal controller 50 transmits the first gate signal and the second gate signal at different transmission timings. This makes it possible for the power conversion apparatus 20 according to the embodiment to avoid a short circuit between the DC buses owing to the transmission timings of the first gate signal and the second gate signal overlapping each other.

After the predetermined period of time has elapsed since the transmission of the first gate signal, the gate signal controller 50 performs the transmission of the second gate signal. This enables the gate drive circuits 40 of the power conversion apparatus 20 according to the embodiment to appropriately receive the second gate signal.

The gate signal controller 50 alternately repeats transmission of the first gate signal and transmission of the second gate signal a plurality of times. When a short circuit between the DC buses is detected again after the gate signal controller 50 transmits the first gate signal for the second or subsequent time or after the gate signal controller 50 transmits the second gate signal for the second or subsequent time, the gate signal controller 50 determines that the positive-side switching elements or the negative-side switching elements have a short-circuit malfunction. Consequently, the power conversion apparatuses 20 according to the embodiment can distinguish whether the short circuit between the DC buses is caused by static electricity or by the short-circuit malfunction of the switching elements 30.

When the motor generator 14 is rotating upon detection of a short circuit between the DC buses, the gate signal controller 50 transmits neither the first gate signal nor the second gate signal and determines that the positive-side switching elements or the negative-side switching elements have a short-circuit malfunction. When the short circuit between the DC buses is detected while the motor generator 14 stops, the gate signal controller 50 transmits the first gate signal and the second gate signal so as to make the DC buses recovery from the short-circuit if the short circuit is caused by a malfunction of either or both of the positive-side gate drive circuit and the negative-side gate drive circuit. This makes it possible for the power conversion apparatuses 20 according to the embodiment to prevent behavior of the vehicle 1 to which the power conversion apparatuses 20 are applied from becoming unstable and prevent the battery 22 from being damaged in the vehicle 1.

In the vehicle 1 according to the embodiment, an insulation material such as a non-metallic sheet may be disposed on metallic part of the case containing the power conversion apparatuses 20. This configuration eliminates or minimizes static electricity applied to the power conversion apparatuses 20.

The embodiment of the disclosure has been described with reference to the accompanying drawings. It should be noted that the disclosure is not limited to such an example. It is apparent to those skilled in the art would conceive various modifications and changes within the scope of claims. It is understood that these modifications and changes fall within the technical scope of the disclosure.

For example, the gate signal controller 50 according to the embodiment alternately transmits the first gate signal and the second gate signal twice. However, the number of times of transmitting each of the first gate signal and the second gate signal is not limited to 2. For example, the gate signal controller 50 may alternately transmit each of the first gate signal and the second gate signal 3 times or more.

Alternatively, the gate signal controller 50 may transmit the first gate signal and the second gate signal once. In this case, although a cause of the short circuit between the DC buses cannot be distinguished, the switching elements 30 can be returned to the "OFF" state at least when the short circuit occurs between the DC buses by the malfunction due to static electricity.

The gate signal controller 50 according to the embodiment transmits the second gate signal after transmitting the first gate signal. However, the gate signal controller 50 may transmit the first gate signal after transmitting the second gate signal. In this case as well, when the short circuit occurs between the DC buses by the malfunction due to static electricity, the switching elements 30 can be returned to the "OFF" state.

The gate signal controller 50 according to the embodiment transmits the first gate signal and the second gate signal at different transmission timings. However, the gate signal controller 50 may transmit the first gate signal and the second gate signal in parallel.

The vehicle 1 according to the embodiment is a series-parallel hybrid vehicle. However, the vehicle 1 is not limited to a series-parallel hybrid vehicle. For example, the vehicle 1 may be a parallel hybrid vehicle and a series hybrid vehicle. The vehicle 1 is not limited to a hybrid vehicle but may be an electric vehicle.

The invention claimed is:

1. A power conversion apparatus comprising:
   a positive-side switching element disposed between a positive-side direct-current bus and an output node;
   a negative-side switching element disposed between a negative-side direct-current bus and the output node;
   a positive-side gate drive circuit configured to turn on and off the positive-side switching element;
   a negative-side gate drive circuit configured to turn on and off the negative-side switching element; and
   a gate signal controller configured to transmit to the positive-side gate drive circuit a gate signal to instruct turning on and off the positive-side switching element and transmit to the negative-side gate drive circuit a gate signal to instruct turning on and off the negative-side switching element, wherein
   the gate signal includes a first gate signal to temporarily turn on and then turn off the positive-side switching element, and a second gate signal to temporarily turn on and then turn off the negative-side switching element, and
   the gate signal controller is configured to, when a short circuit between the positive-side direct-current bus and the negative-side direct-current bus is detected, transmit the first gate signal to the positive-side gate drive circuit and transmit the second gate signal to the negative-side gate drive circuit,
   wherein when the a short circuit between the positive-side direct-current bus and the negative-side direct-current bus is detected while a motor generator coupled to the output node is rotating, the gate signal controller determines that the positive-side switching element or the negative-side switching element has the short-circuit malfunction, without transmitting the first gate signal or the second gate signal, and
   when the short circuit between the positive-side direct-current bus and the negative-side direct-current bus is detected while the motor generator stops, the gate signal controller transmits the first gate signal and the second gate signal so as to cause the positive-side direct-current bus and the negative-side direct-current bus to recover from the short circuit if the short circuit is caused by a malfunction of either or both of the positive-side gate drive circuit and the negative-side gate drive circuit.

2. The power conversion apparatus according to claim 1, wherein the gate signal controller is configured to transmit the first gate signal and the second gate signal at different transmission timings.

3. The power conversion apparatus according to claim 2, wherein the gate signal controller is configured to transmit one of the first gate signal and the second gate signal after a predetermined period of time has elapsed since transmitting the other of the first gate signal and the second gate signal.

4. The power conversion apparatus according to claim 3, wherein the gate signal controller is configured to alternately repeat the transmission of the first gate signal and the transmission of the second gate signal a plurality of times.

5. The power conversion apparatus according to claim 4, wherein when a short circuit between the positive-side direct-current bus and the negative-side direct-current bus is detected again after the gate signal controller transmits the first gate signal for a second or subsequent time or after the gate signal controller transmits the second gate signal for a second or subsequent time, the gate signal controller determines that the positive-side switching element or the negative-side switching element has a short-circuit malfunction.

6. The power conversion apparatus according to claim 4, wherein
when the a short circuit between the positive-side direct-current bus and the negative-side direct-current bus is detected while a motor generator coupled to the output node is rotating, the gate signal controller determines that the positive-side switching element or the negative-side switching element has the short-circuit malfunction, without transmitting the first gate signal or the second gate signal, and
when the short circuit between the positive-side direct-current bus and the negative-side direct-current bus is detected while the motor generator stops, the gate signal controller transmits the first gate signal and the second gate signal so as to cause the positive-side direct-current bus and the negative-side direct-current bus to recover from the short circuit if the short circuit is caused by a malfunction of either or both of the positive-side gate drive circuit and the negative-side gate drive circuit.

7. The power conversion apparatus according to claim 3, wherein
when the a short circuit between the positive-side direct-current bus and the negative-side direct-current bus is detected while a motor generator coupled to the output node is rotating, the gate signal controller determines that the positive-side switching element or the negative-side switching element has the short-circuit malfunction, without transmitting the first gate signal or the second gate signal, and
when the short circuit between the positive-side direct-current bus and the negative-side direct-current bus is detected while the motor generator stops, the gate signal controller transmits the first gate signal and the second gate signal so as to cause the positive-side direct-current bus and the negative-side direct-current bus to recover from the short circuit if the short circuit is caused by a malfunction of either or both of the positive-side gate drive circuit and the negative-side gate drive circuit.

8. The power conversion apparatus according to claim 2, wherein the gate signal controller is configured to alternately repeat the transmission of the first gate signal and the transmission of the second gate signal a plurality of times.

9. The power conversion apparatus according to claim 8, wherein when a short circuit between the positive-side direct-current bus and the negative-side direct-current bus is detected again after the gate signal controller transmits the first gate signal for a second or subsequent time or after the gate signal controller transmits the second gate signal for a second or subsequent time, the gate signal controller determines that the positive-side switching element or the negative-side switching element has a short-circuit malfunction.

10. The power conversion apparatus according to claim 8, wherein
when the a short circuit between the positive-side direct-current bus and the negative-side direct-current bus is detected while a motor generator coupled to the output node is rotating, the gate signal controller determines that the positive-side switching element or the negative-side switching element has the short-circuit malfunction, without transmitting the first gate signal or the second gate signal, and
when the short circuit between the positive-side direct-current bus and the negative-side direct-current bus is detected while the motor generator stops, the gate signal controller transmits the first gate signal and the second gate signal so as to cause the positive-side direct-current bus and the negative-side direct-current bus to recover from the short circuit if the short circuit is caused by a malfunction of either or both of the positive-side gate drive circuit and the negative-side gate drive circuit.

11. The power conversion apparatus according to claim 2, wherein
when the a short circuit between the positive-side direct-current bus and the negative-side direct-current bus is detected while a motor generator coupled to the output node is rotating, the gate signal controller determines that the positive-side switching element or the negative-side switching element has the short-circuit malfunction, without transmitting the first gate signal or the second gate signal, and
when the short circuit between the positive-side direct-current bus and the negative-side direct-current bus is detected while the motor generator stops, the gate signal controller transmits the first gate signal and the second gate signal so as to cause the positive-side direct-current bus and the negative-side direct-current bus to recover from the short circuit if the short circuit is caused by a malfunction of either or both of the positive-side gate drive circuit and the negative-side gate drive circuit.

12. A vehicle comprising:
at least one motor generator configured to generate power on a basis of drive of an engine;
at least one power conversion apparatus configured to supply and receive power to and from the at least one motor generator; and
a vehicle controller configured to control the at least one power conversion apparatus, wherein
the at least one power conversion apparatus comprises
a positive-side switching element disposed between a positive-side direct-current bus and an output node,
a negative-side switching element disposed between a negative-side direct-current bus and the output node,
a positive-side gate drive circuit configured to turn on and off the positive-side switching element,
a negative-side gate drive circuit configured to turn on and off the negative-side switching element, and a gate signal controller configured to transmit to the positive-side gate drive circuit a gate signal to instruct turning on and off the positive-side switching element and transmit to the negative-side gate drive circuit a gate signal to instruct turning on and off the negative-side switching element, the gate signal includes a first gate signal to temporarily turn on and then turn off the positive-side switching element and a second gate signal to temporarily turn on and then turn off the negative-side switching element, when a short circuit between the positive-side direct-current bus and the negative-side direct-current bus is detected, the gate signal controller transmits the first gate signal to the positive-side gate drive circuit and transmits the second gate signal to the negative-side gate drive circuit, and when either or both of a rear gate and a rear door are open, the vehicle controller causes the at least one power conversion apparatus to stop the at least one motor generator.

13. A power conversion apparatus comprising:
a positive-side switching element disposed between a positive-side direct-current bus and an output node;
a negative-side switching element disposed between a negative-side direct-current bus and the output node;
a positive-side gate drive circuit configured to turn on and off the positive-side switching element;
a negative-side gate drive circuit configured to turn on and off the negative-side switching element; and
circuitry configured to transmit to the positive-side gate drive circuit a gate signal to instruct turning on and off the positive-side switching element and transmit to the negative-side gate drive circuit a gate signal to instruct turning on and off the negative-side switching element, wherein the gate signal includes a first gate signal to temporarily turn on and then turn off the positive-side switching element, and a second gate signal to temporarily turn on and then turn off the negative-side switching element, and the circuitry is configured to, when a short circuit between the positive-side direct-current bus and the negative-side direct-current bus is detected, transmit the first gate signal to the positive-side gate drive circuit and transmit the second gate signal to the negative-side gate drive circuit, wherein when the a short circuit between the positive-side direct-current bus and the negative-side direct-current bus is detected while a motor generator coupled to the output node is rotating, the circuitry determines that the positive-side switching element or the negative-side switching element has the short-circuit malfunction, without transmitting the first gate signal or the second gate signal, and when the short circuit between the positive-side direct-current bus and the negative-side direct-current bus is detected while the motor generator stops, the circuitry transmits the first gate signal and the second gate signal so as to cause the positive-side direct-current bus and the negative-side direct-current bus to recover from the short circuit if the short circuit is caused by a malfunction of either or both of the positive-side gate drive circuit and the negative-side gate drive circuit.

* * * * *